United States Patent
Smith

(10) Patent No.: US 6,507,934 B1
(45) Date of Patent: Jan. 14, 2003

(54) APPARATUS AND METHOD FOR SOURCE SYNCHRONOUS LINK TESTING OF AN INTEGRATED CIRCUIT

(75) Inventor: Brian L. Smith, Sunnyvale, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/551,687

(22) Filed: Apr. 18, 2000

(51) Int. Cl.[7] .............................................. G06F 17/50
(52) U.S. Cl. ................... 716/4; 716/6; 327/99; 702/117
(58) Field of Search ................ 716/1–21; 714/724, 714/744, 25, 738, 731, 718, 819, 736, 1; 710/107, 305, 316; 702/119; 375/226; 368/113; 327/298, 99, 159, 141, 172; 326/93; 324/158.1; 73/431

(56) References Cited

U.S. PATENT DOCUMENTS 5,650,734 A * 7/1997 Chu et al. ..................... 326/38
5,742,188 A * 4/1998 Jiang et al. .................... 327/99
6,133,751 A * 10/2000 Churcher et al. .............. 326/49
6,324,485 B1 * 11/2001 Ellis ........................... 702/117

* cited by examiner

Primary Examiner—Vuthe Siek
Assistant Examiner—Helen B Rossoshek
(74) Attorney, Agent, or Firm—Kenta Suzue; Sun Microsystems, Inc.

(57) ABSTRACT

An apparatus or method for testing the setup time and hold time specifications of a chip. An apparatus according to the invention would include a first chip, a second chip, and multiple links coupling the first chip to the second chip. One of the links carries a clock signal between the chips. Other links carrying data have propagation delays different from the propagation delay of the link carrying the clock signal. The relation of the delays for the data links to the delay for the clock link determines a particular setup and/or hold time tested.

18 Claims, 3 Drawing Sheets

APPARATUS AND METHOD FOR SOURCE SYNCHRONOUS LINK TESTING OF AN INTEGRATED CIRCUIT

BACKGROUND

Manufacturers of integrated circuits need to verify that chips do indeed meet design specifications and are suitable for board installation and customer delivery. Two significant parameters of chips are setup time and hold time.

However, the technology of chip design outpaces the technology of testers. Testers lack sufficient resolution to adequately test high speed, state of the art chips. In response, many chips include self-testing circuitry. Various protocols embedded into a chip exist for testing the chip and verifying that the chip meets design specifications. Existing protocols include protocols to test internal circuitry of the chip, and protocols to test the interconnects between chips, such as Interconnect BIST. However, testing setup and hold times remains problematic for high-speed chips.

One way of testing setup and hold times for high speed chips includes the use of source synchronous links. A source synchronous link sends data bits together with a clock signal from a transmitter to a receiver, such as chip to chip. Source synchronous links allow faster chip operation. Setup time and hold time can be tested with a source synchronous link between chips by altering the propagation delays or durations of links carrying data relative to a propagation delay or duration of a link carrying the clock signal, or by altering the duration of the link carrying the clock signal relative to the duration of links carrying data. This approach, however, can be difficult to implement, and have inaccurate results.

Additionally, skew increases the difficulty in correctly testing the setup and hold times. Skew is the difference in propagation delay between two signals transiting different links, caused by manufacturing difficulties in constructing two links to behave precisely the same. Thus, a manufacturer could prematurely rate a given chip as having met specifications, when skew could mean that only some links actually passed.

To be economical, setup and hold times of chips need to be tested very rapidly. Moreover, manufacturers may find it helpful if chips failing to meet setup and/or hold time specifications can be further tested to measure just how closely the failing chips came to meeting the setup and hold time specifications. Further, testing of setup and hold specifications should be scalable, so that the solution can keep pace with increasing chip speeds.

SUMMARY

To overcome the limitations described above, and to overcome other limitations that will become apparent upon reading and understanding the present specification, the present invention discloses an improved circuit board for use in systems that test chips for compliance with setup and/or hold time specifications. It is one object of the invention to provide a circuit board having a first chip, and a second chip to be tested coupled to the first chip, with multiple links of different lengths for testing the setup time and/or hold time of the second chip. It is another object of the invention to test skew within a bus. It is a further object of the invention to not only test whether the second chip met specifications for setup time and/or hold time, but also test how much the second chip exceeded or failed specifications.

In accordance with these objects, the present invention includes a circuit board comprising a first chip, a second chip, and a plurality of links coupling the first chip and the second chip. A first link carries a clock signal between the first chip and the second chip; the clock signal takes a first duration to transit the first link. A second link is associated with a second duration for data transiting the second link. The shorter the second duration relative to the first duration, the earlier the data transiting the second link arrives at the second chip, relative to the clock signal transiting the first link arriving at the second chip. The longer the second duration relative to the first duration, the later the data transiting the second link arrives at the second chip, relative to the clock signal.

In one embodiment, the plurality of links includes at least one link for carrying data to test a setup time of a second chip, and at least one link for carrying data to test a hold time of the second chip. After the data arrives at the second chip, the data are checked to verify that the setup and the hold times of the second chip are adequate.

The present invention is also scalable for future processors with shorter setup and hold times; the setup and hold time specifications may be tested after appropriately adjusting the lengths of the plurality of links coupling the first and second chips.

DETAILED DESCRIPTION

The invention is described in various embodiments in the following description with reference to the Figures, in which like numbers represent the same or similar elements. While this invention is described in terms of the best mode for achieving this invention's objectives, it will be appreciated by those skilled in the art that variations may be accomplished in view of those teachings without deviating from the spirit of scope of the invention.

Figure 1:
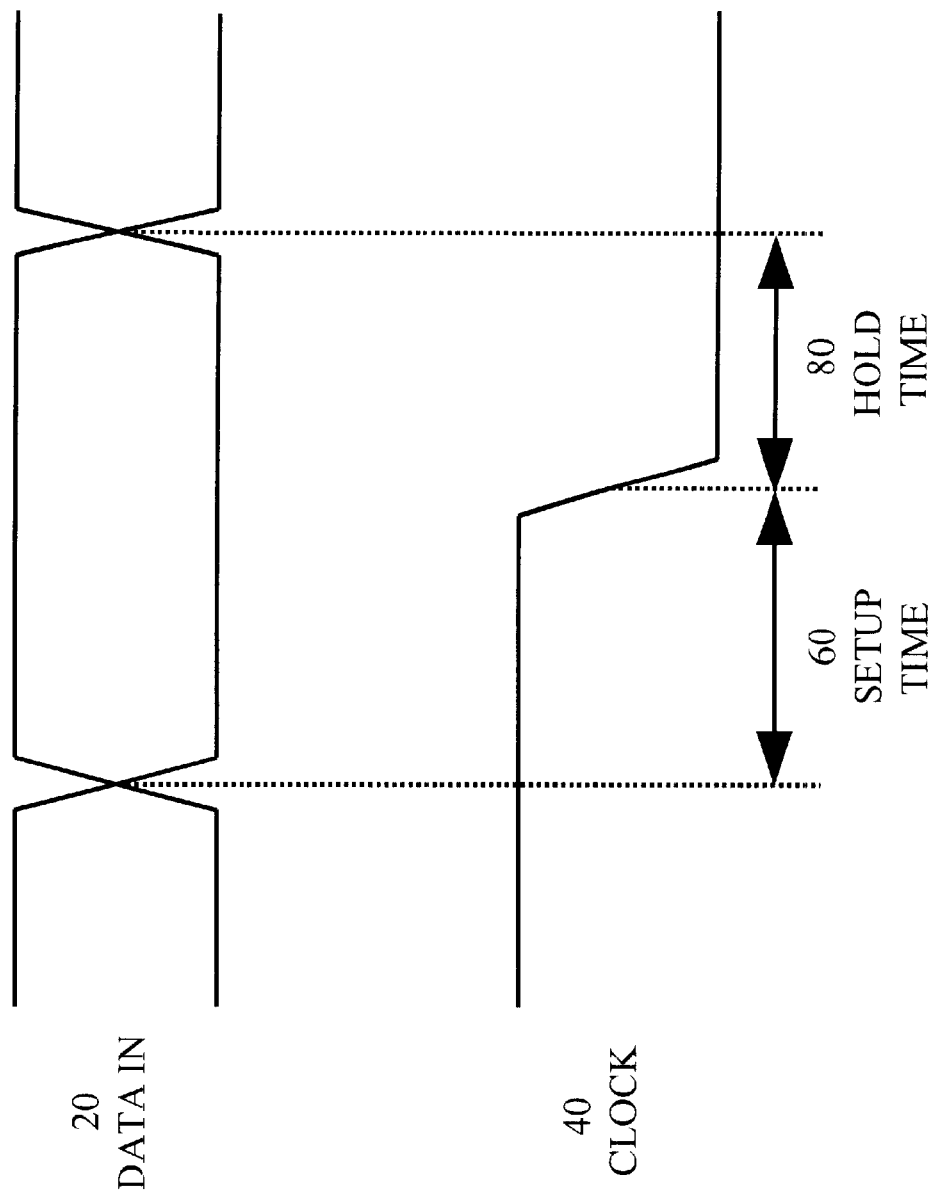
FIG. 1 is a diagram of a clock signal and a data in signal showing a setup time and a hold time.

FIG. 1 shows an illustrative example of a clock signal and a data-in signal. Setup time 60 is a minimum length of time that a data input 20 to a chip should be stable before a transition of a clock 40. Hold time 80 is a minimum length of time that the data input to the chip should be stable after a transition of the clock 40. If either the setup time or the hold time of tested chip is too short, or in other words, if the specification for the setup or the hold time is too long, the chip may fail to correctly clock in the input data. A chip with shorter setup and hold times permits transmitted data to be valid for a shorter time without resulting in errors at the receiver. Setup and hold times may be negative or zero. If the data input can change after the clock transition and the chip can still correctly clock in the input data, then the chip has a negative setup time. If the data input can change before the clock transition and the chip can still correctly clock in the input data, then the chip has a positive hold time. Manufacturers need a way to rapidly test setup and hold times of chips coming off of a production line.

Figure 2:
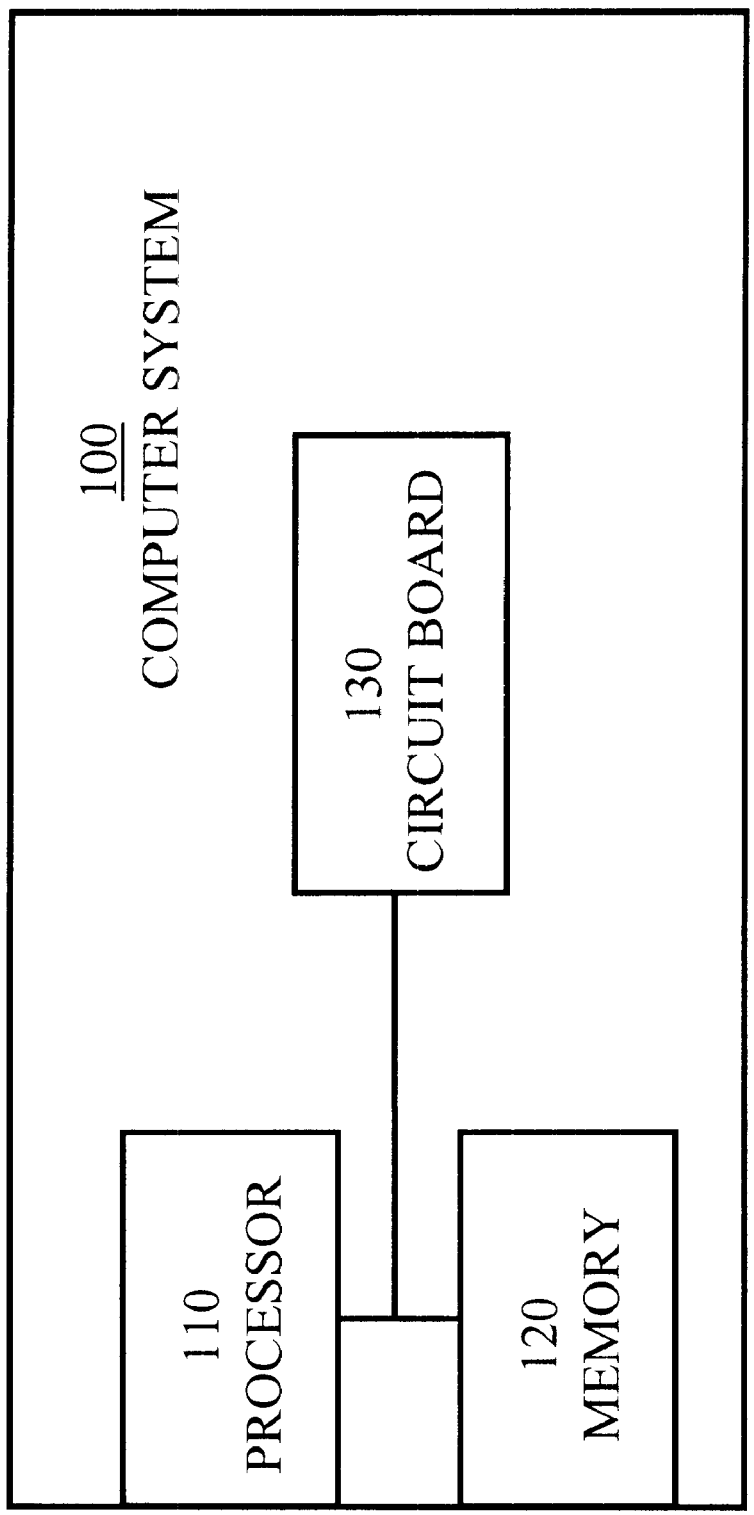
FIG. 2 is a block diagram of a computer system including an improved circuit board according to the present invention.

FIG. 2 shows a computer system 100. The computer system 100 includes a processor 110, a memory 120, and a circuit board 130. The circuit board 130 is electrically coupled to the processor 110 and the memory 120. The computer system 100 may be a production tester for testing if manufactured chips meet setup and hold time specifications. Testing includes verifying whether a chip meets specifications, measuring the setup time and hold time of the chip, and characterizing skew across different links of a port. A port includes a link carrying a clock signal and data links grouped with the link carrying the clock signal.

Figure 3:
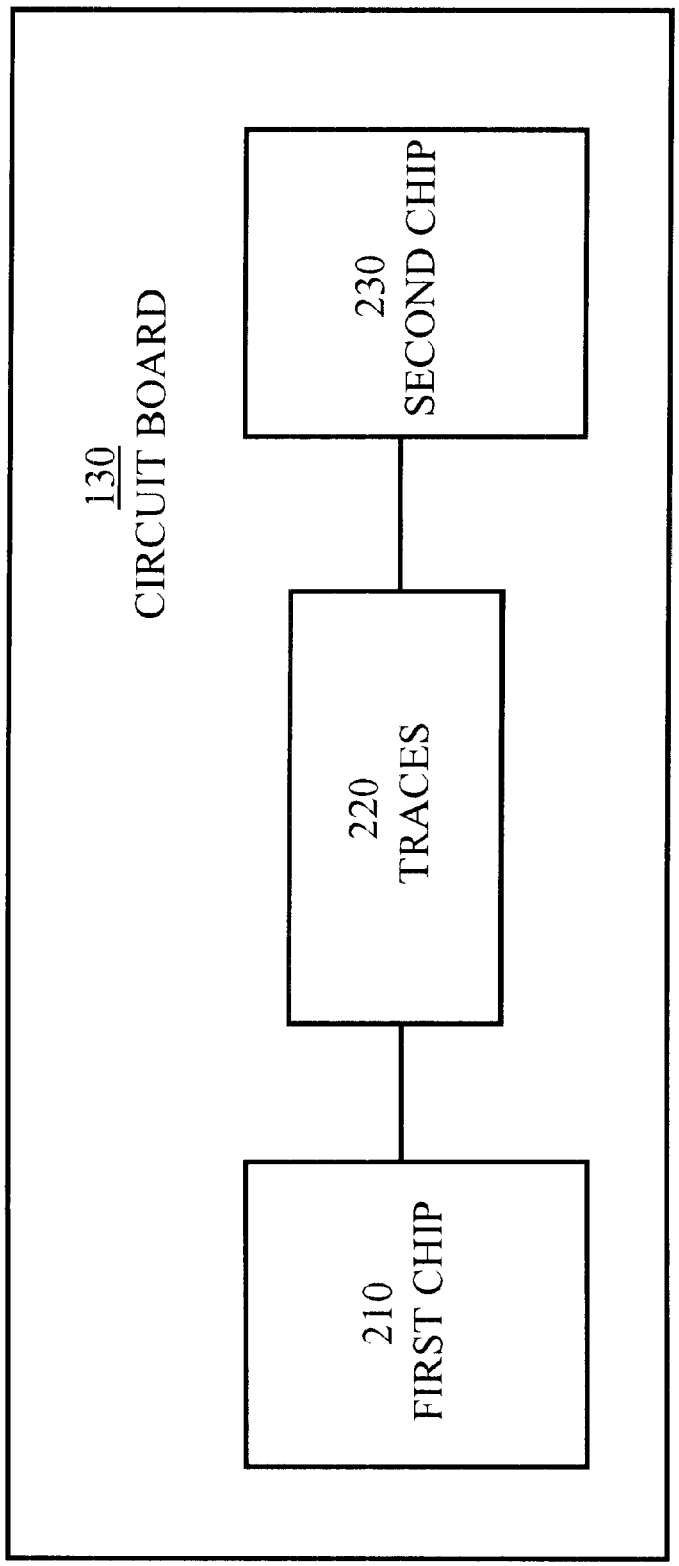
FIG. 3 is a block diagram of the improved circuit board shown in FIG. 2.

FIG. 3 shows the circuit board 130. The circuit board 130 includes a first chip 210, a second chip 230, and a plurality of links 220 coupling the first chip 210 and the second chip 230.

The first chip 210 includes one or more previously evaluated chips, the "golden set." In some cases, one chip may be sufficient, if one chip includes enough terminals or ports to test some or all of the terminals or ports to be tested on the second chip 230. In other cases, one chip will not have enough terminals or ports to test some or all of the terminals or ports to be tested on the second chip 230. In this case, the first chip 210 may include more than one chip to test the second chip 230.

The plurality of links 220 includes at least two links. A link is a transmission medium for carrying electrical signals such as circuit board traces and wires, or a transmission medium for carrying optical signals such as fiber optic cable. A first link has a first propagation delay or first duration and carries a clock signal between the first chip 210 and the second chip 230. The plurality of links 220 further includes one or more other links characterized by one or more durations. It is well known in the art how to use software tools to design a link to achieve a given propagation delay or duration so that a given setup time and/or hold time may be tested.

The propagation delay or duration of a link is influenced by a physical length and/or physical construction of the link. That duration may test a particular setup or hold time. Two links may share the same duration yet have different actual physical lengths due to differences in positioning and construction.

In addition to the first link for carrying the clock signal, the plurality of links 220 may include only one or more links for testing the setup time, only one or more links for testing the hold time, or some combination of one or more links for testing the setup time and one or more links for testing the hold time. Links may be adapted to test the same setup time or the same hold time, and share the same duration. Alternatively, links may have slightly different durations, with each slightly different duration optimized to test a slightly different setup time or a slightly different hold time of the second chip.

Links within the plurality of links 220 may be interleaved, such that a link with a relatively short duration is adjacent to a link with a relatively long duration. Interleaving links in this manner helps compensate for skew in the testing of the setup and hold times. Different patterns for interleaving may be optimal, depending on the particular skew distribution across a given port of multiple links, and a given physical implementation. For example, a port having a linear skew distribution across the lines may be suited for a different interleaving pattern than a port having a nonlinear skew distribution across the lines. In one case, if the first few links of the plurality of links 220 have a skew relative to the clock link which is different from a skew of the last few links of the plurality of links 220 relative to the clock link, interleaving links having relatively short durations with links having relatively long durations helps to minimize effects of skew. Links in the plurality of links 220 may also be designed to have the same duration, so that measured differences between the putatively identical links may indicate skew between the links. For example, if two links are designed to have a same duration, but one link fails and the other link passes, then skew can exist between the links. Comprehensive testing can include multiple links of the same designed duration to ensure that the second chip passes setup and hold requirements even with any skew effects.

Regarding the clock signal, setup time and hold time can be handled relative to the same clock edge or different clock edges. For example, setup time can be specified relative to a leading edge of a data bit, and hold time can be specified relative to a trailing edge of a data bit.

One example of data sent across the links 220 to test setup and hold times is data following a protocol to test source synchronous links between two chips. One such protocol is Interconnect BIST. An advantage of following a protocol for testing source synchronous links to send the data for testing setup and hold times is that such a protocol may include worst case data sets. Worst case data sets exist for testing different parameters and situations, such as hold time, setup time, positive clock edges, and negative clock edges. A protocol for testing source synchronous links may also run at speed of operation in actual use, so that the setup and hold time may be tested for a chip running at full speed. Thus, a chip manufacturer is assured that setup and hold time specifications are met under worst case scenarios. Other examples of data sent across the links can include as little as two or three bits, just enough to test the setup and hold times with respect to one or two clock edges. The data sent through the links may be the same data from link to link or different. Another advantage of following such a protocol is that the protocol may already be embedded in the chip logic, removing a need to further modify the chip design for the sole purpose of testing the setup and hold times of the chip. The data sent by the first chip and received at the second chip are checked, and records kept about what bit failed and what bits passed. Chips meeting setup and hold time specifications can be further tested for compliance with other specifications and shipped to customers, while chips failing setup and hold time specifications can be discarded or further analyzed to discover the reasons for the failure to meet specifications.

In one embodiment of the invention, the plurality of links 220 includes a first link for carrying the clock signal, a subplurality of links for testing the setup time, and another subplurality of links for testing the hold time. Manufacturers can use this embodiment to very rapidly test setup and hold times of chips coming off of a production line by replacing in rapid succession a tested second chip 230 with a second chip 230 to be tested.

In another embodiment of the invention, the plurality of links 220 includes a first link for carrying the clock signal, a subplurality of links for testing a plurality of setup times, and a subplurality of links for testing a plurality of hold times. Having multiple links of different durations for testing setup time and multiple links of different durations for testing hold time adds granularity to the measurement of setup and hold times. This embodiment can be used to further test chips that failed to meet setup and/or hold time specifications. Beyond knowing whether a chip failed setup and hold specifications, a chip manufacturer may be interested in knowing how close a chip came to passing setup and hold time specifications. For example, the required specification for a given chip may be a setup time of 0.97 nanoseconds. If the chip passes testing with links having durations for testing setup times of at least 1.00 nanosecond, but fails testing with links having durations for testing setup times of less than 0.99 nanoseconds, then the manufacturer realizes not only that the particular chip failed to meet the required specification, but also realizes how much more improvement is required in the manufacturing process. Further, because this embodiment includes multiple lengths, chips of varying setup and hold times can be tested. Alternatively, for a chip meeting setup and hold specifications, this embodiment may also measure how much the chip exceeds setup and hold time specifications. Manufacturers can also gain some idea of the yield distribution of a given batch of chips under test. A given batch of chips under test may follow a Gaussian distribution of performance, where most chips have an average performance, and some chips perform very well or very badly; testing may define a shape of this Gaussian distribution. This embodiment also allows use of the same circuit board 130 to test different chips with different setup and hold times.

A method according to the present invention sends a clock signal from a first chip 210 to a second chip 230 through a first link of a plurality of links 220. Data are sent from the first chip 210 to the second chip 230 through a second link of the plurality of links 220. The second duration relative to the first duration determines a tested value of a setup time and/or a hold time. It can then be determined the second chip meets the required setup and/or hold time specifications.

While various embodiments of the present invention have been illustrated herein in detail, it should be apparent that modifications and adaptations to those embodiments may occur to those skilled in the art without departing from the scope of the present invention as set forth in the following claims.

What is claimed is:

1. A circuit board for chip testing, comprising:
   a previously evaluated chip;
   a second chip having to be tested at least one of a setup time and a hold time; and
   a plurality of links for coupling the previously evaluated chip and the second chip, the plurality of links comprising:
   a first link for carrying a clock signal, wherein the clock signal carried by the first link takes a first duration to propagate from the previously evaluated chip to the second chip; and
   a second link for carrying data that tests at least one of the hold time of the second chip and the setup time of the second chip, wherein data carried by the second link takes a second duration to propagate from the previously evaluated chip to the second chip.

2. The circuit board of claim 1, wherein the plurality of links further comprises:
   a third link for carrying data that tests at least one of the hold time of the second chip and the setup time of the second chip, wherein data carried by the third link takes a third duration to propagate from the previously evaluated chip to the second chip.

3. The circuit board of claim 2, wherein the second link tests the hold time and the third link tests the setup time.

4. The circuit board of claim 2, wherein the second link and the third link carry data for testing the setup time of the second chip.

5. The circuit board of claim 2, wherein the second link and the third link carry data for testing the hold time of the second chip.

6. The circuit board of claim 2, wherein the second link and the third link carry data for testing skew of the second link and the third link.

7. The circuit board of claim 2, wherein the plurality of links further comprises:
   a first subplurality of links, the first subplurality of links having a first plurality of durations, and each of the first plurality of durations relative to the first duration of the first link determines a tested value for a hold time; and
   a second subplurality of links including, the second subplurality of links having a second plurality of durations, and each of the second plurality of durations relative to the first duration of the first link determines a tested value for a setup time.

8. The circuit board of claim 7, wherein the first subplurality of links and the second subplurality of links are interleaved, such that several links of the first subplurality are adjacent to at least one link from the second subplurality.

9. The circuit board of claim 1, wherein the previously evaluated chip is one of a plurality of previously evaluated chips for testing the second chip.

10. A method of chip testing, comprising:
    delaying a clock signal by a first duration, by sending the clock signal from a previously evaluated chip to a second chip through a first link; and
    delaying data by a second duration, by sending the data from the previously evaluated chip to the second chip through a second link, wherein the second duration relative to the first duration determines a tested value of one of a setup time of the second chip and a hold time of the second chip.

11. The method of claim 10, further comprising:
    delaying data by a third duration, by sending the data from the previously evaluated chip to the second chip through a third link, wherein the third duration relative to the first duration determines a tested value of one of a setup time of the second chip and a hold time of the second chip.

12. The method of claim 11, wherein the second link carries data for testing the hold time of the second chip and the third link carries data for testing the setup time of the second chip.

13. The method of claim 11, wherein the second link and the third link carry data for testing the hold time of the second chip.

14. The method of claim 11, wherein the second link and the third link carry data for testing the setup time of the second chip.

15. The method of claim 11, wherein the second link and the third link carry data for testing skew of the second link and the third link.

16. The method of claim 11, wherein the delaying steps test how much the second chip exceeded or failed a specification for one or more of a setup time and a hold time of the second chip.

17. The method of claim 11, wherein the data follows a protocol for testing interconnects between the previously evaluated chip and the second chip.

18. A computer system for chip testing, comprising:
    a processor;
    a memory; and
    a board electrically coupled to the processor and the memory, comprising:
    a previously evaluated chip;
    a second chip having to be tested at least one of a setup time and a hold time; and
    a plurality of links for coupling the previously evaluated chip and the second chip, the plurality of links comprising:

a first link for carrying a clock signal, wherein the clock signal carried by the first link takes a first duration to propagate from the previously evaluated chip to the second chip; and a second link for carrying data that tests at least one of the hold time of the second chip and the setup time of the second chip, wherein data carried by the second link takes a second duration to propagate from the previously evaluated chip to the second chip.

* * * * *